United States Patent
Katagiri

(10) Patent No.: US 11,982,000 B2
(45) Date of Patent: May 14, 2024

(54) COATED CUTTING TOOL

(71) Applicant: TUNGALOY CORPORATION, Fukushima (JP)

(72) Inventor: Takao Katagiri, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 0 days.

(21) Appl. No.: 18/050,771

(22) Filed: Oct. 28, 2022

(65) Prior Publication Data

US 2023/0203668 A1 Jun. 29, 2023

(30) Foreign Application Priority Data

Dec. 10, 2021 (JP) ................... 2021-200875

(51) Int. Cl.
*C23C 14/06* (2006.01)
*C04B 41/50* (2006.01)
(Continued)

(52) U.S. Cl.
CPC .......... *C23C 28/44* (2013.01); *C04B 41/5063* (2013.01); *C04B 41/5068* (2013.01);
(Continued)

(58) Field of Classification Search
CPC ............ B23B 2224/08; B23B 2224/24; B23B 2224/32; B23B 2224/36; C23C 14/0658; C23C 14/0664; C23C 14/0641; C23C 14/0647; C23C 16/34; C23C 16/342; C23C 16/347; C23C 16/36; C23C 30/005;
(Continued)

(56) References Cited

U.S. PATENT DOCUMENTS

2005/0129986 A1* 6/2005 Sata .................... C23C 14/0641
428/698
2010/0119315 A1* 5/2010 Kathrein ........... C23C 16/45523
407/119
(Continued)

FOREIGN PATENT DOCUMENTS

CN 111270202 A * 6/2020 ......... C23C 14/0021
CN 113201724 A * 8/2021 ............. B23D 79/00
(Continued)

OTHER PUBLICATIONS

Machine translation of KR 2011/0134026 A, obtained from KIPO.*
(Continued)

*Primary Examiner* — Z. Jim Yang
(74) *Attorney, Agent, or Firm* — Studebaker & Brackett PC

(57) ABSTRACT

A coated cutting tool including a substrate and a coating layer formed on the substrate, wherein the coating layer has an alternately laminated structure of a first layer and a second layer, the first layer contains a compound having a composition represented by $(Al_aTi_{1-a})N$ ($0.80 \leq a \leq 0.95$), the second layer contains a compound having a composition represented by $(Al_bM_cTi_{1-b-c})N$ (M represents at least one of Si or B, $0.80 \leq b \leq 0.95$, and $0 < c \leq 0.20$), a and b satisfy $|a-b| \leq 0.05$, and an average thickness of the alternately laminated structure is 1.0 μm or more and 10.0 μm or less.

13 Claims, 1 Drawing Sheet

(51) Int. Cl.
*C23C 28/00* (2006.01)
*C23C 30/00* (2006.01)

(52) U.S. Cl.
CPC .......... *C23C 14/0641* (2013.01); *C23C 28/42* (2013.01); *C23C 30/005* (2013.01); *B23B 2224/24* (2013.01)

(58) Field of Classification Search
CPC .......... C23C 28/04–44; C04B 41/5062; C04B 41/5063; C04B 41/5064; C04B 41/5068
See application file for complete search history.

(56) References Cited

U.S. PATENT DOCUMENTS

| | | | | |
|---|---|---|---|---|
| 2012/0114436 | A1* | 5/2012 | Andersson | C04B 41/009 407/119 |
| 2012/0201615 | A1* | 8/2012 | Ni | C23C 28/048 407/30 |
| 2012/0237792 | A1* | 9/2012 | Inspektor | C23C 14/0641 427/255.15 |
| 2013/0065081 | A1* | 3/2013 | Ni | C23C 28/044 428/660 |
| 2015/0050490 | A1* | 2/2015 | Kumar | C23C 14/024 106/286.2 |
| 2015/0152561 | A1* | 6/2015 | Kang | C23C 28/027 428/698 |
| 2017/0312830 | A1 | 11/2017 | Asanuma | |
| 2018/0099335 | A1* | 4/2018 | Takeshita | C23C 28/044 |
| 2018/0193924 | A1* | 7/2018 | Tanaka | C23C 14/0658 |
| 2018/0245201 | A1* | 8/2018 | Park | C23C 14/548 |
| 2018/0281079 | A1* | 10/2018 | Tanaka | C23C 28/42 |
| 2018/0311742 | A1* | 11/2018 | Tatsuoka | C23C 16/45523 |
| 2018/0347027 | A1* | 12/2018 | Kumar | B23B 27/148 |
| 2019/0061013 | A1* | 2/2019 | Hirano | C23C 14/0641 |
| 2019/0161849 | A1* | 5/2019 | Rutten | C23C 14/0652 |
| 2021/0071290 | A1* | 3/2021 | Park | C23C 28/04 |
| 2021/0108306 | A1* | 4/2021 | Kurapov | C23C 14/0641 |
| 2022/0111446 | A1* | 4/2022 | Ishigaki | B23B 51/00 |
| 2022/0281013 | A1* | 9/2022 | Schröder | C23C 14/0664 |
| 2022/0297196 | A1* | 9/2022 | Josefsson | C23C 28/40 |
| 2022/0371099 | A1* | 11/2022 | Dobashi | C23C 14/024 |

FOREIGN PATENT DOCUMENTS

| | | | | |
|---|---|---|---|---|
| JP | 2015066644 | A | * | 4/2015 |
| JP | 2016-093857 | A | | 5/2016 |
| JP | 2017056497 | A | * | 3/2017 |
| JP | 2019005867 | A | * | 1/2019 |
| KR | 20110134026 | A | * | 12/2011 |
| WO | WO-2013002385 | A1 | * | 1/2013 ......... C23C 14/0641 |

OTHER PUBLICATIONS

Machine translation of WO 2013/002385 A1.*
Machine translation of JP 2015/066644 A.*
Machine translation of JP 2017/056497 A.*
Machine translation of JP 2019/005867 A.*
Machine translation of CN 111270202 A.*
Machine translation of CN 113201724 A.*

* cited by examiner

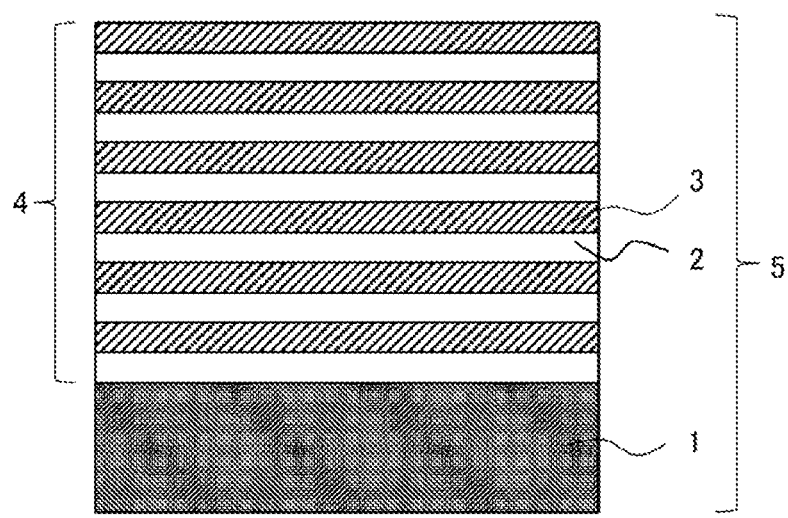

COATED CUTTING TOOL

BACKGROUND OF THE INVENTION

Field of the Invention

The present invention relates to a coated cutting tool.

Description of Related Art

In the related art, cutting tools made of cemented carbide or cubic boron nitride (cBN) sintered body have been widely used for cutting and processing steel or the like. Among them, surface coated cutting tools containing one or two or more hard coating films such as a TiN layer, a TiAlN layer and a TiCrN layer on a surface of a cemented carbide substrate are used for various processing due to high versatility thereof.

For example, Patent Publication JP-A-2016-093857 suggests a surface coated cutting tool obtained by forming a hard coating layer having a total layer thickness of 0.5 to 10 μm on a surface of a tool base made of WC group cemented carbide and TiCN group cermet by vapor deposition, wherein the hard coating layer is composed of an alternately laminated structure of an A layer and a B layer, the A layer satisfies $0.50 \leq a < 0.75$ when represented by a composition formula: $(Al_aTi_{1-a})N$ (provided that, a is an atomic ratio), the B layer satisfies $0.75 \leq b \leq 0.95$ when represented by a composition formula: $(Al_bTi_{1-b})N$ (provided that, b is an atomic ratio), and $5y \geq x \geq 3y$ and $250 (nm) \geq x+y \geq 100 (nm)$ are satisfied when a layer thickness per layer of the A layer is taken as x (nm) and a layer thickness per layer of the B layer is taken as y (nm).

SUMMARY

Technical Problem

In recent years, lathe processing of stainless steel and the like tends to require high speed and high feed. While the cutting conditions tend to be more stringent than conventional conditions, it is required to improve the wear resistance and the fracture resistance more than before and to extend the tool life. In the surface coated cutting tool of Patent Publication JP-A-2016-093857, it is suggested to form an alternately laminated structure made of a TiAlN layer having an atomic ratio of Al of 75% or more and a TiAlN layer having an atomic ratio of Al of less than 75%, and further, to improve the wear resistance by controlling the layer thicknesses of the above two layers to appropriate ranges. However, since the proportion of the TiAlN layer having a low content of Al is high in the coating layer, the effect of the layer having a high content of Al which has high hardness tends not to be exerted sufficiently, and there is thus a room for improvement.

The present invention has been made in light of the above circumstances, and an object of the present invention is to provide a coated cutting tool having improved wear resistance and fracture resistance and a long tool life.

Solution to Problem

The present inventor has conducted research on extending a tool life of a coated cutting tool, and has found that when the coated cutting tool has a specific configuration, it is possible to improve wear resistance and fracture resistance thereof, and as a result, the tool life of the coated cutting tool can be extended. Thus, the invention has been completed.

That is, the gist of the present invention is as follows.

[1] A coated cutting tool comprising a substrate and a coating layer formed on the substrate, wherein
the coating layer has an alternately laminated structure of a first layer and a second layer;
the first layer contains a compound having a composition represented by a following formula (1):

$(Al_aTi_{1-a})N$     (1)

(in the formula (1), a is an atomic ratio of an Al element to a total of the Al element and a Ti element and satisfies $0.80 \leq a \leq 0.95$);
the second layer contains a compound having a composition represented by a following formula (2):

$(Al_bM_cTi_{1-b-c})N$     (2)

(in the formula (2), M represents at least one of Si or B, b is an atomic ratio of the Al element to a total of the Al element, an M element and the Ti element and satisfies $0.80 \leq b \leq 0.95$, and c is an atomic ratio of the M element to the total of the Al element, the M element and the Ti element and satisfies $0 < c \leq 0.20$);
a and b satisfy $|a-b| \leq 0.05$; and
an average thickness of the alternately laminated structure is 1.0 μm or more and 10.0 μm or less.

[2] The coated cutting tool according to [1], wherein an average thickness per layer of the first layer is 5 nm or more and 50 nm or less; and
an average thickness per layer of the second layer is 5 nm or more and 50 nm or less.

[3] The coated cutting tool according to [1] or [2], wherein a composition of the entire compound of the alternately laminated structure is represented by a following formula (3):

$(Al_dM_eTi_{1-d-e})N$     (3)

(in the formula (3), M represents at least one of Si or B; d is an atomic ratio of the Al element to the total of the Al element, the M element and the Ti element and satisfies $0.80 \leq d \leq 0.95$, and e is an atomic ratio of the M element to the total of the Al element, the M element and the Ti element and satisfies $0 \leq e < 0.20$).

[4] The coated cutting tool according to [3], wherein $0 < e \leq 0.10$ is satisfied in the formula (3).

[5] The coated cutting tool according to any one of [1] to [4], wherein a residual stress of the alternately laminated structure is −10.0 GPa or more and −2.0 GPa or less.

[6] The coated cutting tool according to any one of [1] to [5], wherein where a sum of diffraction peak intensities of a cubic crystal (111) plane and a cubic crystal (200) plane is denoted by $I_{cub}$ and a diffraction peak intensity of a hexagonal crystal (110) plane is denoted by $I_{hex}$ in X-ray diffraction of the alternately laminated structure, $I_{hex}/I_{cub}$ is 0 or more and 0.30 or less.

[7] The coated cutting tool according to any one of [1] to [6], wherein the coating layer has a lower layer between the substrate and the alternately laminated structure;
the lower layer is a single layer or a multilayer of a compound composed of at least one element selected from the group consisting of Ti, Zr, Hf, V, Nb, Ta, Cr, Mo, W, Al, Si, and Y and at least one element selected from the group consisting of C, N, O, and B (provided that, the compound composed of the composition represented by the formula (1) and the compound composed of the composition represented by the formula (2) are excluded); and
an average thickness of the lower layer is 0.1 μm or more and 2.0 μm or less.
[8] The coated cutting tool according to any one of [1] to [7], wherein the coating layer has an upper layer on a surface opposite to the substrate in the alternately laminated structure;
the upper layer is a single layer or a multilayer of a compound composed of at least one element selected from the group consisting of Ti, Zr, Hf, V, Nb, Ta, Cr, Mo, W, Al, Si, and Y and at least one element selected from the group consisting of C, N, O, and B (provided that, the compound composed of the composition represented by the formula (1) and the compound composed of the composition represented by the formula (2) are excluded); and
an average thickness of the upper layer is 0.1 μm or more and 2.0 μm or less.
[9] The coated cutting tool according to any one of [1] to [8], wherein an average thickness of an entire coating layer is 1.0 μm or more and 10.0 μm or less.

Advantageous Effects of Invention

According to the present invention, it is possible to provide a coated cutting tool having improved wear resistance and fracture resistance and a long tool life.

BRIEF DESCRIPTION OF DRAWINGS

The FIGURE is a schematic view showing an example of a coated cutting tool of the present invention.

DETAILED DESCRIPTION

Hereinafter, an embodiment for implementing the present invention (hereinafter, simply referred to as "the present embodiment") will be described in detail, but the present invention is not limited to the following embodiment. The present invention can be modified in various ways without departing from the gist thereof. In the drawings, the same elements are designated by the same reference numerals, and repeated description will be omitted. Further, unless otherwise specified, a positional relationship such as up, down, left, and right is based on a positional relationship shown in the drawing. Furthermore, a dimensional ratio in the drawing is not limited to a ratio shown.

The coated cutting tool of the present embodiment is a coated cutting tool including a substrate and a coating layer formed on the substrate, wherein
the coating layer has an alternately laminated structure of a first layer and a second layer,
the first layer contains a compound having a composition represented by a following formula (1):

$(Al_aTi_{1-a})N$ (1)

(in the formula (1), a is an atomic ratio of an Al element to a total of the Al element and a Ti element and satisfies 0.80≤a≤0.95),
the second layer contains a compound having a composition represented by a following formula (2):

$(Al_bM_cTi_{1-b-c})N$ (2)

(in the formula (2), M represents at least one of Si or B, b is an atomic ratio of the Al element to a total of the Al element, an M element and the Ti element and satisfies 0.80≤b≤0.95, and c is an atomic ratio of the M element to the total of the Al element, the M element and the Ti element and satisfies 0<c≤0.20);
a and b satisfy |a−b|≤0.05, and
an average thickness of the alternately laminated structure is 1.0 μm or more and 10.0 μm or less.

Factors why such a coated cutting tool has improved wear resistance and fracture resistance, and a long tool life are not clear in detail, but it is estimated as follows. However, the factors are not limited thereto.

When a in $(Al_aTi_{1-a})N$ which is the composition represented by the formula (1) in the first layer which forms the alternately laminated structure is 0.80 or more, the hardness is increased and the oxidation resistance is improved, so that the wear resistance of the coated cutting tool is excellent. Meanwhile, when a is 0.95 or less, the formation of hexagonal crystals is suppressed, so that the reduction of the hardness can be suppressed.

Then, b in $(Al_bM_cTi_{1-b-c})N$ which is the composition represented by the formula (2) is 0.80 or more in the second layer of the alternately laminated structure, the hardness is increased and the oxidation resistance is improved, so that the wear resistance of the coated cutting tool is excellent. Meanwhile, when b is 0.95 or less, the formation of hexagonal crystals is suppressed, so that the reduction of the hardness can be suppressed. Further, when c is more than 0 in the formula (2), at least one of Si or B is contained, so that the formation of microstructure is facilitated, a high hardness is achieved, and the wear resistance of the coated cutting tool is improved. Meanwhile, when c is 0.20 or less, the peeling of the coating layer that may occur in the case of a high content of Si or B can be suppressed, so that the wear resistance and fracture resistance of the coated cutting tool are improved.

Since the coating layer has such an alternately laminated structure of the first layer and the second layer, the propagation of the cracks to the substrate occurring during processing can be suppressed, so that the fracture resistance of the coated cutting tool is improved.

Further, with respect to a and b in the formulas (1) and (2), when the absolute value of the difference thereof, (|a−b|) is 0.05 or less, a large amount of Al is contained over the entire alternately laminated structure. Thus, the oxidation resistance and wear resistance of the coated cutting tool is improved, and also, the adhesiveness between the first layer and the second layer is improved. Further, when the average thickness of the entire alternately laminated structure is 1.0 μm or more, the wear resistance of the coated cutting tool is improved. When the average thickness of the entire alternately laminated structure is 10.0 μm or less, the peeling of the coating layer can be suppressed, so that the fracture resistance of the coated cutting tool is improved. Combined with these effects, the coated cutting tool of the present embodiment has improved wear resistance and fracture resistance, and a long tool life.

The coated cutting tool of the present embodiment includes a substrate and a coating layer formed on the surface of the substrate. The substrate used in this embodiment is not particularly limited as long as it can be used for a coated cutting tool. Examples of such a substrate include a cemented carbide, a cermet, a ceramic, a cubic boron nitride sintered body, a diamond sintered body, and high-speed steel. Among them, the substrate is further preferably one or more selected from a group consisting of a cemented carbide, a cermet, a ceramic, and a cubic boron nitride sintered body, because more excellent wear resistance and fracture resistance of the coated cutting tool can be realized.

In the coated cutting tool of the present embodiment, the average thickness of the entire coating layer is preferably 1.0 µm or more and 10.0 µm or less. In the coated cutting tool of the present embodiment, when the average thickness of the entire coating layer is 1.0 µm or more, the wear resistance of the coated cutting tool is improved. In the coated cutting tool of the present embodiment, when the average thickness of the entire coating layer is 10.0 µm or less, the fracture resistance is improved mainly because the peeling of the coating layer is suppressed. From the same viewpoint, the average thickness of the entire coating layer is more preferably 1.6 µm or more and 8.0 µm or less, and further preferably 2.4 µm or more and 6.0 µm or less.

First Layer

In the coated cutting tool of the present embodiment, the first layer is a compound layer containing a compound having a composition represented by the following formula (1). In the following formula (1), a is an atomic ratio of an Al element to a total of the Al element and a Ti element and satisfies 0.80≤a≤0.95.

$$(Al_aTi_{1-a})N \quad (1)$$

In the first layer which forms the alternately laminated structure, when a in $(Al_aTi_{1-a})N$ is 0.80 or more, the hardness is increased, and the oxidation resistance is improved, so that the wear resistance of the coated cutting tool is excellent. Meanwhile, when a is 0.95 or less, the formation of hexagonal crystals is suppressed, so that the reduction of the hardness can be suppressed. From the same viewpoint, a in $(Al_aTi_{1-a})N$ is preferably 0.80 or more and 0.93 or less, and more preferably 0.80 or more and 0.90 or less.

Further, in the present embodiment, when the composition of each compound layer is expressed as, for example, $(Al_{0.80}Ti_{0.20})N$, the atomic ratio of the Al element to the total of the Al element and the Ti element is 0.80, and the atomic ratio of the Ti element to the total of the Al element and the Ti element is 0.20. That is, it means that the amount of the Al element to the total amount of the Al element and the Ti element is 80%, and the amount of the Ti element to the total amount of the Al element and the Ti element is 20%.

Second Layer

In the coated cutting tool of the present embodiment, the second layer is a compound layer containing a compound having a composition represented by the following formula (2). In the following formula (2), M represents at least one of Si or B, b is an atomic ratio of the Al element to a total of the Al element, an M element and the Ti element and satisfies 0.80≤b≤0.95, and c is an atomic ratio of the M element to the total of the Al element, the M element and the Ti element and satisfies 0<c≤0.20.

$$(Al_bM_cTi_{1-b-c})N \quad (2)$$

In the second layer which forms the alternately laminated structure, when b in $(Al_bM_cTi_{1-b-c})N$ is 0.80 or more, the hardness is increased and the oxidation resistance is improved, so that the wear resistance of the coated cutting tool is excellent. Meanwhile, when b is 0.95 or less, the formation of hexagonal crystals is suppressed, so that the reduction of the hardness can be suppressed. From the same viewpoint, b in $(Al_bM_cTi_{1-b-c})N$ is preferably 0.80 or more and 0.93 or less, and more preferably 0.80 or more and 0.90 or less.

Further, when c is more than 0 in $(Al_bM_cTi_{1-b-c})N$, at least one of Si or B is contained, so that the formation of microstructure is facilitated, a high hardness is achieved, and the wear resistance of the coated cutting tool is improved. Meanwhile, when c is 0.20 or less, the peeling of the coating layer that may occur in the case of a high content of Si or B can be suppressed, so that the wear resistance and fracture resistance of the coated cutting tool are improved. From the same viewpoint, c in $(Al_bM_cTi_{1-b-c})N$ is preferably 0.02 or more and 0.12 or less, and 0.02 or more and 0.09 or less.

In the formula (2), the M element is at least one of Si or B. The term "at least one of Si or B" includes a case where either one of Si or B is contained and a case where both Si and B are contained. When B is contained, the residual stress of the alternately laminated structure is higher as compared with the case of containing Si, and the adhesiveness between the first layer and the second layer tends to be further improved. From such a viewpoint, the M element preferably contains more B than Si, and is more preferably B.

Further, when the lower layer described below is not formed in the coated cutting tool of the present embodiment, it is preferred first to form the first layer on the surface of the substrate. When the first layer is first formed on the surface of the substrate in the coated cutting tool of the present embodiment, the adhesiveness between the substrate and the coating layer tends to be improved.

[Alternately Laminated Structure]

In the coating layer, the coated cutting tool of the present embodiment has an alternately laminated structure in which the first layer and the second layer are alternately laminated. When the coated cutting tool of the present embodiment has the alternately laminated structure in which the first layer and the second layer are alternately laminated in the coating layer, the propagation of the cracks to the substrate occurring during processing can be suppressed, so that the fracture resistance is improved. Further, when in the alternately laminated structure, the composition of the first layer is $(Al_aTi_{1-a})N$ which satisfies the formula (1) and the composition of the second layer is $(Al_bM_cTi_{1-b-c})N$ which satisfies the formula (2), a large amount of Al is contained over the entire alternately laminated structure, so that the hardness of the entire coating layer is improved and the wear resistance of the coated cutting tool is improved.

The coated cutting tool of the present embodiment preferably has a number of repetitions of the first layer and the second layer of 2 times or more, more preferably 5 times or more and 1,000 times or less, and further preferably 24 times or more and 400 times or less in the alternately laminated structure.

In the present embodiment, when one first layer and one second layer are formed, the "number of repetitions" is 1 time.

In the coated cutting tool of the present embodiment, the average composition of the alternately laminated structure is preferably represented by the following formula (3).

$$(Al_dM_eTi_{1-d-e})N \quad (3)$$

Here, M represents at least one of Si or B, d is an atomic ratio of the Al element to the total of the Al element, the M element and the Ti element and satisfies 0.80≤d≤0.95, and e is an atomic ratio of the M element to the total of the Al element, the M element and the Ti element and satisfies 0<e<0.20. When d is 0.80 or more, the hardness is increased and the oxidation resistance is improved, so that the wear resistance of the coated cutting tool tends to be excellent. Meanwhile, when d is 0.95 or less, the formation of hexagonal crystals is suppressed, so that there is a tendency that the reduction of the hardness can be suppressed. From the same viewpoint, d is more preferably 0.80 or more and 0.91 or less, and further preferably 0.80 or more and 0.88 or less.

Further, when e is more than 0, at least one of Si or B is contained, so that the formation of microstructure is facilitated, a high hardness is achieved, and the wear resistance of the coated cutting tool tends to be improved. Meanwhile, when e is less than 0.20, the peeling of the coating layer that may occur in the case of a high content of Si or B can be suppressed, so that the wear resistance and fracture resistance of the coated cutting tool tend to be improved.

In the above formula (3), e which is the atomic ratio of the M element to the total of the Al element, the M element and the Ti element is more preferably 0<e≤0.10. When e is more than 0, Si or B is contained, so that the formation of microstructure is facilitated, the hardness is increased, and the wear resistance of the coated cutting tool tends to be improved. Meanwhile, when e is 0.10 or less, the peeling of the coating layer due to the excess content of Si or B can be further suppressed, so that the wear resistance and fracture resistance of the coated cutting tool tend to be further improved. From the same viewpoint, e in the above formula (3) is further preferably 0.01 or more and 0.10 or less, and particularly preferably 0.02 or more and 0.06 or less.

In the coated cutting tool of the present embodiment, the average thickness per layer of each of the first layer and the second layer is preferably 5 nm or more and 50 nm or less. When the average thickness per layer of each of the first layer and the second layer in the alternately laminated structure is 5 nm or more, the phenomenon of the propagation of the cracks to the substrate occurring during processing can be suppressed in the alternately laminated structure, so that the fracture resistance of the coated cutting tool tends to be further improved. Further, when the average thickness per layer of each of the first layer and the second layer in the alternately laminated structure is 50 nm or less, the adhesiveness between the first layer and the second layer is improved, so that the fracture of the tool due to the peeling of the coating layer tends to be suppressed. From the same viewpoint, the average thickness per layer of each of the first layer and the second layer in the alternately laminated structure is more preferably 15 nm or more and 40 nm or less, and further preferably 20 nm or more and 30 nm or less.

The average thicknesses per layer of the first layer and the second layer may be the same or different from each other.

In the coated cutting tool of the present embodiment, the average thickness of the alternately laminated structure is not particularly limited, and for example, may be 1.0 μm or more and 10.0 μm or less like the average thickness of the entire coating layer. The average thickness of the alternately laminated structure is more preferably 1.6 μm or more and 8.0 μm or less, and further preferably 2.4 μm or more and 6.0 μm or less. When the average thickness of the alternately laminated structure is 1.0 μm or more, the wear resistance of the coated cutting tool tends to be improved. Meanwhile, when the average thickness of the alternately laminated structure is 10.0 μm or less, the fracture resistance tends to be improved mainly because the peeling of the coating layer is suppressed.

Further, in the coated cutting tool of the present embodiment, it is preferable that the residual stress of the alternately laminated structure be −10.0 GPa or more and −2.0 GPa or less. When the residual stress of the alternately laminated structure is −10.0 GPa or more, the peeling of the coating layer is suppressed, so that the wear resistance and fracture resistance of the coated cutting tool tend to be improved. Meanwhile, when the residual stress of the alternately laminated structure is −2.0 GPa or less, the propagation of the cracks to the substrate can be suppressed by the effect of having the compressive stress, so that the fracture resistance of the coated cutting tool tends to be improved. From the same viewpoint, the residual stress of the alternately laminated structure is more preferably −9.0 GPa or more and −3.0 GPa or less, and further preferably −8.0 GPa or more and −4.0 GPa or less.

The above residual stress refers to an internal stress (inherent distortion) remaining in the alternately laminated structure. In general, a stress represented by a "−" (minus) value is referred to as a compressive stress, and a stress represented by a "+" (plus) value is referred to as a tensile stress. In the present embodiment, when indicating the magnitude of a residual stress, a greater "+" value means a greater residual stress, and a smaller "−" value means a smaller residual stress.

The above residual stress can be measured by a $\sin^2 \varphi$ method using an X-ray diffractometer. Such residual stress can be measured by: measuring, through the $\sin^2 \varphi$ method, the stresses at any three locations included in a portion involved in cutting (such locations are preferably selected so as to be apart from one another by 0.5 mm or more, such that the relevant stresses typify the stresses of the above portion); and obtaining the average value of such stresses.

In the coated cutting tool of the present embodiment, when the sum of diffraction peak intensities of a cubic crystal (111) plane and a cubic crystal (200) plane is denoted by $I_{cub}$ and a diffraction peak intensity of a hexagonal crystal (110) plane is denoted by $I_{hex}$ in the X-ray diffraction of the alternately laminated structure, $I_{hex}/I_{cub}$ is preferably 0 or more and 0.30 or less. When $I_{hex}/I_{cub}$ is 0.30 or less, the formation of the hexagonal crystals is suppressed, so that the hardness is increased and the wear resistance of the coated cutting tool tends to be further improved. From the same viewpoint, in the alternately laminated structure, a lower $I_{hex}/I_{cub}$ tends to be more preferable, and $I_{hex}/I_{cub}$ is more preferably 0 or more and 0.26 or less, and further preferably 0 or more and 0.20 or less.

The peak intensity of each plane index in the coating layer of the present embodiment can be calculated by using a commercially available X-ray diffractometer. For example, the above peak intensity of each plane index can be measured by using an X-ray diffractometer RINT TTR III (product name) manufactured by Rigaku Corporation and performing X-ray diffraction measurement with a 2θ/θ focused optical system using Cu-Kα rays under the following conditions. Here, the measurement conditions are output: 50 kV, 250 mA, incident side solar slit: 5°, divergent vertical slit: 2/3°, divergent vertical limiting slit: 5 mm, scattering slit: 2/3°, light receiving side solar slit: 5°, light receiving slit: 0.3 mm, BENT monochromator, light receiving monochrome slit: 0.8 mm, sampling width: 0.01°, scan speed: 4°/min, and 2θ measurement range: 20° to 70°. When obtaining the above peak intensity of each plane index from the X-ray diffraction pattern, the analysis software provided with the X-ray diffractometer may be used. In the analysis software, each peak intensity can be obtained by performing background processing and Kα2 peak removal using a cubic approximation, and performing profile fitting using the Pearson-VII function. Specifically, each peak intensity can be measured and calculated by the method described in Examples described below.

The FIGURE is a schematic cross-sectional view showing an example of a coated cutting tool of the present embodiment. The coated cutting tool 5 includes a substrate 1 and a coating layer 4 formed on the surface of the substrate 1. The coating layer 4 has an alternately laminated structure in which the first layer 2 and the second layer 3 are alternately formed from the substrate 1 side. In the alternately laminated structure shown in the FIGURE, the alternate formation of the first layer 2 and the second layer 3 is repeated 6 times.

Lower Layer

The coating layer used in the present embodiment may be composed of only the alternately laminated structure of the first layer and the second layer, but it is preferable to include a lower layer between the substrate and the alternately laminated structure of the first layer and the second layer. The adhesiveness between the substrate and the coating layer tends to be further improved by having the lower layer. From the same viewpoint, the lower layer is preferably a single layer or a multilayer of a compound composed of at least one element selected from the group consisting of Ti, Zr, Hf, V, Nb, Ta, Cr, Mo, W, Al, Si, and Y and at least one element selected from the group consisting of C, N, O, and B (provided that, the compound composed of the composition represented by the formula (1) and the compound composed of the composition represented by the formula (2) are excluded), more preferably a single layer or a multilayer of a compound composed of at least one element selected from the group consisting of Ti, V, Nb, Ta, Cr, Mo, W, Al, Si, and Y and at least one element selected from the group consisting of C, N, O, and B (provided that, the compound composed of the composition represented by the formula (1) and the compound composed of the composition represented by the formula (2) are excluded), further preferably a single layer or a multilayer of a compound composed of at least one element selected from the group consisting of Ti, Ta, Cr, W, Al, Si, and Y, and N, and particularly preferably a single layer or a multilayer of a compound composed of at least one element selected from the group consisting of Ti, Al, and Si, and N. The specific compound included in the lower layer is not particularly limited, and examples thereof include TiN, TiAlN, and TiAlSiN.

In the present embodiment, it is preferable that the average thickness of the lower layer be 0.1 μm or more and 2.0 μm or less because the adhesion between the substrate and the coating layer tends to be further improved. From the same viewpoint, the average thickness of the lower layer is more preferably 0.1 μm or more and 1.0 μm or less, and further preferably 0.2 μm or more and 0.5 μm or less.

Upper Layer

The coating layer used in the present embodiment may be composed of only the alternately laminated structure of the first layer and the second layer, but may include an upper layer on the surface opposite to the substrate in the alternately laminated structure. The upper layer is preferably a single layer or a multilayer of a compound composed of at least one element selected from the group consisting of Ti, Zr, Hf, V, Nb, Ta, Cr, Mo, W, Al, Si, and Y and at least one element selected from the group consisting of C, N, O, and B (provided that, the compound composed of the composition represented by the formula (1) and the compound composed of the composition represented by the formula (2) are excluded). When the upper layer is a single layer or a multilayer of the compound as described above, the wear resistance tends to be more excellent. From the same viewpoint, the upper layer more preferably includes a compound composed of at least one element selected from the group consisting of Ti, V, Nb, Ta, Cr, Mo, W, Al, Si, and Y, and at least one element selected from the group consisting of C, N, O, and B (provided that, the compound composed of the composition represented by the formula (1) and the compound composed of the composition represented by the formula (2) are excluded), further preferably a compound composed of at least one element selected from the group consisting of Ti, Nb, Ta, Cr, W, Al, Si, and Y, and N, and particularly preferably a compound composed of at least one element selected from the group consisting of Ti, Al, and Si, and N. The specific compound included in the upper layer is not particularly limited, and examples thereof include TiN, TiAlN, and TiSiN. Further, the upper layer may be a single layer or may be a multilayer of two or more layers.

In the coating layer used in the present embodiment, the average thickness of the upper layer is preferably 0.1 μm or more and 2.0 μm or less. When the average thickness of the upper layer is 0.1 μm or more, the wear resistance of the coated cutting tool tends to be improved. When the average thickness of the upper layer is 2.0 μm or less, the fracture resistance of the coated cutting tool tends to be improved mainly because the peeling of the coating layer is suppressed. From the same viewpoint, the average thickness of the upper layer is more preferably 0.2 μm or more and 1.5 μm or less, and further preferably 0.5 μm or more and 1.0 μm or less.

Method for Manufacturing Coating Layer

A method of manufacturing the coating layer in the coated cutting tool of the present embodiment is not particularly limited, and examples thereof include a physical vapor deposition method such as an ion plating method, an arc ion plating method, a sputtering method, and an ion mixing method. Use of the physical vapor deposition method for forming the coating layer is preferred because a sharp edge can be formed. Among them, the arc ion plating method is more preferred because the adhesion between the coating layer and the substrate is more excellent.

Method for Manufacturing Coated Cutting Tool

A method of manufacturing the coated cutting tool of the present embodiment will be described below with reference to specific examples. The method of manufacturing the coated cutting tool of the present embodiment is not particularly limited as long as a configuration of the coated cutting tool can be implemented.

First, a substrate processed into a tool shape is housed in a reaction vessel of a physical vapor deposition device, and a metal evaporation source is disposed in the reaction vessel. Then, the inside of the reaction vessel is evacuated until a pressure thereof is a vacuum of $1.0 \times 10^{-2}$ Pa or less, and the temperature of the substrate is controlled to a temperature of 200° C. to 700° C. by a heater in the reaction vessel. After heating, Ar gas is introduced into the reaction vessel to make the pressure in the reaction vessel to 0.5 Pa to 5.0 Pa. In an Ar gas atmosphere with a pressure of 0.5 Pa to 5.0 Pa, a bias voltage of −500 V to −350 V is applied to the substrate, a current of 40 A to 50 A is flowed through a tungsten filament in the reaction vessel, and the surface of the substrate is subjected to an ion bombardment treatment with Ar gas. After the surface of the substrate is subjected to the ion bombardment treatment, the inside of the reaction vessel is evacuated until the pressure is a vacuum of $1.0 \times 10^{-2}$ Pa or less.

When forming the lower layer used in the present embodiment, the substrate is controlled until the temperature reaches 200° C. to 250° C. After controlling, gas is introduced into the reaction vessel to make the pressure inside the reaction vessel to 3.0 Pa to 7.0 Pa. The gas is, for example, $N_2$ gas when the lower layer is formed of a compound containing N and at least one element selected from the group consisting of Ti, Zr, Hf, V, Nb, Ta, Cr, Mo, W, Al, Si, and Y. Further, when the lower layer is formed of a compound containing N, C and at least one element selected from the group consisting of Ti, Zr, Hf, V, Nb, Ta, Cr, Mo, W, Al, Si, and Y, the gas is, for example, a mixed gas of $N_2$ gas and $C_2H_2$ gas. A volume ratio of the mixed gas is not particularly limited, and may be, for example, $N_2$ gas:$C_2H_2$ gas=95:5 to 85:15. Next, a bias voltage of −80 V to −40 V may be applied to the substrate, and the metal evaporation source corresponding to a metal component of each layer may be evaporated by an arc discharge of an arc current of 100 A to 150 A to form the lower layer.

When forming the first layer used in the present embodiment, the temperature of the substrate is controlled to be 200° C. to 300° C., $N_2$ gas is introduced into the reaction vessel, and the pressure inside the reaction vessel is set to 8.0 Pa to 12.0 Pa. After that, a bias voltage of −400 V to −200 V may be applied to the substrate, and the evaporation source of Al and Ti may be evaporated by an arc discharge of 80 A to 120 A to form the first layer.

When forming the second layer used in the present embodiment, the temperature of the substrate is controlled to be 200° C. to 300° C. It is preferable to set the temperature of the substrate to the same temperature as the temperature of the substrate when the first layer is formed, because the first layer and the second layer can be continuously formed. After controlling the temperature, $N_2$ gas is introduced into the reaction vessel, and the pressure inside the reaction vessel is set to 8.0 Pa to 12.0 Pa. Next, a bias voltage of −400 V to −200 V may be applied to the substrate, and the metal evaporation source corresponding to a metal component of the second layer may be evaporated by an arc discharge of an arc current of 80 A to 120 A to form the second layer.

In order to form an alternately laminated structure in which two or more first layers and second layers are alternately laminated, the evaporation source of Al and Ti and the metal evaporation source corresponding to the metal component of the second layer may be alternately evaporated under the above-described conditions by an arc discharge to form each layer alternately. By adjusting each arc discharge time of the evaporation source of Al and Ti and the metal evaporation source corresponding to the metal component of the second layer, the thickness of each layer constituting the alternately laminated structure can be controlled.

In order to set the composition of the entire compound in the alternately laminated structure used in the present embodiment to a predetermined value, the thickness of each layer in the alternately laminated structure and the ratio of the metal element in each layer may be adjusted in the aforementioned process of forming the alternately laminated structure.

In order to set the X-ray diffraction intensity ratio, $I_{hex}/I_{cub}$ in the coating layer used in the present embodiment to a predetermined value, the temperature of the substrate, the bias voltage, or the atomic ratio of each metal element may be adjusted in the process of forming the aforementioned alternately laminated structure. More specifically, when the temperature of the substrate is lowered or the negative bias voltage is increased (direction away from zero) in the process of forming the alternately laminated structure, $I_{hex}/I_{cub}$ tends to be smaller. Further, when the atomic ratio of the Al element is reduced and the atomic ratio of the Ti element is increased in the process of forming the alternately laminated structure, $I_{hex}/I_{cub}$ tends to be smaller.

In order to set the residual stress of the alternately laminated structure in the coating layer used in the present embodiment to a predetermined value, the temperature of the substrate, the bias voltage, the pressure inside the reaction vessel, or the atomic ratio of each metal element may be adjusted in the process of forming the aforementioned alternately laminated structure. More specifically, when the temperature of the substrate is raised, the negative bias voltage is made small (near zero), the pressure inside the reaction vessel is increased (for example, 8.0 Pa or more), or the atomic ratio of the M element (at least one of Si or B) is made small in the process of forming the alternately laminated structure, the residual stress in the coating layer tends to be larger.

When forming the upper layer used in the present embodiment, that the upper layer may be formed under the same manufacturing conditions as those of the lower layer described above. That is, first, the temperature of the substrate is controlled until the temperature thereof reaches 200° C. to 250° C. After controlling, gas is introduced into the reaction vessel to make the pressure in the reaction vessel to 3.0 Pa to 7.0 Pa. The gas is, for example, $N_2$ gas when the upper layer is formed of a compound containing N and at least one element selected from the group consisting of Ti, Zr, Hf, V, Nb, Ta, Cr, Mo, W, Al, Si, and Y. Further, when the upper layer is formed of a compound containing N, C and at least one element selected from the group consisting of Ti, Zr, Hf, V, Nb, Ta, Cr, Mo, W, Al, Si, and Y, the gas is, for example, a mixed gas of $N_2$ gas and $C_2H_2$ gas. A volume ratio of the mixed gas is not particularly limited, and may be, for example, $N_2$ gas:$C_2H_2$ gas=95:5 to 85:15. Next, a bias voltage of −80 V to −40 V may be applied to the substrate, and the metal evaporation source corresponding to a metal component of each layer may be evaporated by an arc discharge of an arc current of 100 A to 150 A to form the upper layer.

The thickness of each layer forming the coating layer in the coated cutting tool of the present embodiment is measured from a cross-sectional structure of the coated cutting tool using an optical microscope, a scanning electron microscope (SEM), a transmission electron microscope (TEM), or the like. The average thickness of each layer in the coated cutting tool of the present embodiment can be obtained by measuring the thickness of each layer from three or more cross sections in the vicinity of a position 50 μm from a cutting edge ridgeline portion of a surface facing the metal evaporation source toward a center portion of the surface and by calculating an average value (arithmetic mean value).

Further, the composition of each layer forming the coating layer in the coated cutting tool of the present embodiment can be measured from the cross-sectional structure of the coated cutting tool of the present embodiment by using an energy dispersive X-ray analyzer (EDS) or a wavelength dispersive X-ray analyzer (WDS).

It is considered that the coated cutting tool of the present embodiment has an effect that the tool life can be extended as compared with that in the related art because the coated cutting tool is excellent in at least wear resistance and fracture resistance (however, the factors that can extend the tool life are not limited to the above). Specific examples of types of the coated cutting tool of the present embodiment include an indexable cutting insert for milling or lathe processing, a drill, or an end mill.

EXAMPLES

Hereinafter, the invention will be described in more detail by way of Examples, but the present invention is not limited to these examples.

Example 1

As a substrate, a cemented carbide having a composition of 94.7% WC-5.0% Co-0.3% $Cr_3C_2$ (mass %) processed into an insert shape of CNMG120408-SM (manufactured by Tungaloy Corporation) was prepared. A metal evaporation source was arranged in the reaction vessel of the arc ion plating device so as to obtain the composition of the compound layer shown in Tables 1 and 2. The prepared substrate was fixed to a fixing bracket of a rotary table in the reaction vessel.

After that, the inside of the reaction vessel was evacuated until the pressure reached a vacuum of $5.0 \times 10^{-3}$ Pa or less. After evacuation, the substrate was heated to 450° C. with a heater in the reaction vessel. After heating, Ar gas was introduced into the reaction vessel so that the pressure became 2.7 Pa.

In the Ar gas atmosphere with a pressure of 2.7 Pa, a bias voltage of −400 V was applied to the substrate, a current of 40 A was passed through the tungsten filament in the reaction vessel, and the surface of the substrate was subjected to ion bombardment treatment with Ar gas for 30 min. After the ion bombardment treatment was completed, the inside of the reaction vessel was evacuated until the pressure reached a vacuum of $5.0 \times 10^{-3}$ Pa or less.

For the invention samples 1 to 25 and the comparative samples 1 to 18, after vacuuming, the substrate was controlled so that the temperature thereof became such as shown in Tables 3 and 4 (the temperature at the start of film formation), nitrogen gas ($N_2$) was introduced into the reaction vessel, and the pressure inside the reaction vessel was adjusted to that shown in Tables 3 and 4. Then, the bias voltage shown in Tables 3 and 4 was applied to the substrate to alternately evaporate the metal evaporation sources of the first layer and the second layer having the composition shown in Tables 1 and 2 by the arc discharge of the arc current shown in Tables 3 and 4 in the order presented, and the first layer and the second layer were formed on the surface of the substrate in the order presented. At this time, the pressure in the reaction vessel was controlled to that shown in Tables 3 and 4. Further, the thicknesses of the first layer and the second layer were controlled by adjusting each arc discharge time so as to have the thicknesses shown in Tables 1 and 2.

After forming the compound layer on the surface of the substrate to the predetermined average thickness shown in Tables 1 and 2, the power of the heater was turned off, and after the sample temperature became 100° C. or lower, the sample was taken out from the reaction vessel.

An average thickness of the compound layer of the obtained sample was obtained by observing, using a TEM, three cross sections in the vicinity of a position 50 μm from a cutting edge ridgeline portion of a surface of the coated cutting tool facing the metal evaporation source toward a center portion of the surface, measuring the thickness of each layer, and calculating an average value (arithmetic mean value). The average thickness per layer of the first layer was calculated as a value obtained by dividing the total thickness which is the sum of the thicknesses of each first layer by the number of the first layers (number of repetitions). The average thickness per layer of the second layer was also calculated as a value obtained by dividing the total thickness which is the sum of the thicknesses of each second layer by the number of the second layers (number of repetitions). The results are shown in Tables 1 and 2.

The composition of each compound layer of the obtained sample was measured by using an EDS attached to the TEM in a cross section in the vicinity of the position 50 μm from the cutting edge ridgeline portion of the surface of the coated cutting tool facing the metal evaporation source toward the center portion. The composition difference |a−b| was calculated by obtaining the absolute value of the difference between a and b which was obtained by the measurement method. The results are also shown in Tables 1 and 2. Further, d and e values in the composition $(Al_dM_eTi_{1-d-e})N$ represented by the formula (3) in the entire compound of the alternately laminated structure were measured by using an EDS attached to the TEM. Specifically, the surface of the alternately laminated structure was analyzed in a cross section in the vicinity of the position 50 μm from the cutting edge ridgeline portion of the surface of the coated cutting tool facing the metal evaporation source toward the center portion. At this time, the measurement range was taken as "the length of 80% of the average thickness of the alternately laminated structure"דthe length of 80% of the average thickness of the alternately laminated structure"×"1 μm (the length in the direction substantially parallel to the substrate surface) or more". Each atomic ratio in the average composition $(Al_dM_eTi_{1-d-e})N$ of the alternately laminated structure was obtained from the results of the surface analysis. The results are shown in Table 5 and Table 6.

TABLE 1

| | Coating layer | | | | | | | |
|---|---|---|---|---|---|---|---|---|
| | Alternately laminated structure | | | | | | | |
| | First layer $(Al_aTi_{1-a})$ N | | Second layer $(Al_bM_cTi_{1-b-c})$ N | | | | | |
| Sample No. | Composition (a value) | Average thickness per layer (nm) | Composition (b value) | Element M | Composition (c value) | Average thickness per layer (nm) | Composition difference \|a − b\| | Number of repetitions (times) | Total average thickness (μm) |
| Invention sample 1 | 0.85 | 25 | 0.85 | B | 0.06 | 25 | 0.00 | 80 | 4.0 |
| Invention sample 2 | 0.95 | 25 | 0.95 | B | 0.02 | 25 | 0.00 | 80 | 4.0 |
| Invention sample 3 | 0.80 | 25 | 0.80 | B | 0.12 | 25 | 0.00 | 80 | 4.0 |
| Invention sample 4 | 0.90 | 40 | 0.93 | B | 0.03 | 20 | 0.03 | 70 | 4.2 |
| Invention sample 5 | 0.80 | 20 | 0.83 | B | 0.09 | 40 | 0.03 | 70 | 4.2 |
| Invention sample 6 | 0.90 | 30 | 0.85 | B | 0.10 | 20 | 0.05 | 80 | 4.0 |
| Invention sample 7 | 0.85 | 25 | 0.83 | B | 0.12 | 25 | 0.02 | 80 | 4.0 |
| Invention sample 8 | 0.85 | 25 | 0.85 | B | 0.04 | 25 | 0.00 | 200 | 10.0 |
| Invention sample 9 | 0.85 | 25 | 0.85 | B | 0.06 | 25 | 0.00 | 24 | 1.2 |
| Invention sample 10 | 0.80 | 25 | 0.80 | B | 0.20 | 25 | 0.00 | 80 | 4.0 |
| Invention sample 11 | 0.80 | 25 | 0.80 | B | 0.02 | 25 | 0.00 | 80 | 4.0 |
| Invention sample 12 | 0.85 | 25 | 0.85 | Si | 0.06 | 25 | 0.00 | 80 | 4.0 |
| Invention sample 13 | 0.95 | 25 | 0.95 | Si | 0.02 | 25 | 0.00 | 80 | 4.0 |
| Invention sample 14 | 0.80 | 25 | 0.80 | Si | 0.12 | 25 | 0.00 | 80 | 4.0 |
| Invention sample 15 | 0.80 | 25 | 0.80 | Si | 0.20 | 25 | 0.00 | 80 | 4.0 |
| Invention sample 16 | 0.85 | 25 | 0.85 | Si | 0.02 | 25 | 0.00 | 80 | 4.0 |

TABLE 1-continued

| | Coating layer | | | | | | | |
|---|---|---|---|---|---|---|---|---|
| | Alternately laminated structure | | | | | | | |
| | First layer (Al$_a$Ti$_{1-a}$)N | | Second layer (Al$_b$M$_c$Ti$_{1-b-c}$)N | | | | | |
| Sample No. | Composition (a value) | Average thickness per layer (nm) | Composition (b value) | Element M | Composition (c value) | Average thickness per layer (nm) | Composition difference \|a − b\| | Number of repetitions (times) | Total average thickness (μm) |
| Invention sample 17 | 0.85 | 25 | 0.85 | B | 0.06 | 25 | 0.00 | 80 | 4.0 |
| Invention sample 18 | 0.85 | 25 | 0.85 | B | 0.06 | 25 | 0.00 | 80 | 4.0 |
| Invention sample 19 | 0.85 | 5 | 0.85 | B | 0.06 | 5 | 0.00 | 400 | 4.0 |
| Invention sample 20 | 0.85 | 15 | 0.85 | B | 0.06 | 15 | 0.00 | 80 | 2.4 |
| Invention sample 21 | 0.85 | 30 | 0.85 | B | 0.06 | 30 | 0.00 | 100 | 6.0 |
| Invention sample 22 | 0.85 | 50 | 0.85 | B | 0.06 | 50 | 0.00 | 40 | 4.0 |
| Invention sample 23 | 0.80 | 25 | 0.80 | B | 0.06 | 25 | 0.00 | 80 | 4.0 |
| Invention sample 24 | 0.95 | 25 | 0.95 | B | 0.04 | 25 | 0.00 | 32 | 1.6 |
| Invention sample 25 | 0.85 | 25 | 0.85 | B | 0.08 | 25 | 0.00 | 160 | 8.0 |

TABLE 2

| | Coating layer | | | | | | | |
|---|---|---|---|---|---|---|---|---|
| | Alternately laminated structure | | | | | | | |
| | First layer (Al$_a$Ti$_{1-a}$)N | | Second layer (Al$_b$M$_c$Ti$_{1-b-c}$)N | | | | | |
| Sample No. | Composition (a value) | Average thickness per layer (nm) | Composition (b value) | Element M | Composition (c value) | Average thickness per layer (nm) | Composition difference \|a − b\| | Number of repetitions (times) | Total average thickness (μm) |
| Comparative sample 1 | 0.85 | 4000 | — | — | — | — | — | 1 | 4.0 |
| Comparative sample 2 | — | — | 0.85 | B | 0.06 | 4000 | — | 1 | 4.0 |
| Comparative sample 3 | 0.97 | 25 | 0.95 | B | 0.02 | 25 | 0.02 | 80 | 4.0 |
| Comparative sample 4 | 0.80 | 25 | 0.76 | B | 0.12 | 25 | 0.04 | 80 | 4.0 |
| Comparative sample 5 | 0.90 | 25 | 0.80 | B | 0.06 | 25 | 0.10 | 80 | 4.0 |
| Comparative sample 6 | 0.90 | 25 | 0.84 | B | 0.06 | 25 | 0.06 | 80 | 4.0 |
| Comparative sample 7 | 0.85 | 25 | 0.85 | B | 0.06 | 25 | 0.00 | 220 | 11.0 |
| Comparative sample 8 | 0.85 | 25 | 0.85 | B | 0.06 | 25 | 0.00 | 16 | 0.8 |
| Comparative sample 9 | 0.95 | 20 | 0.93 | — | — | 30 | 0.02 | 80 | 4.0 |
| Comparative sample 10 | 0.80 | 25 | 0.76 | B | 0.12 | 25 | 0.04 | 80 | 4.0 |
| Comparative sample 11 | 0.79 | 25 | 0.83 | B | 0.06 | 25 | 0.04 | 80 | 4.0 |
| Comparative sample 12 | 0.83 | 25 | 0.79 | B | 0.06 | 25 | 0.04 | 80 | 4.0 |
| Comparative sample 13 | 0.83 | 3 | 0.79 | B | 0.06 | 3 | 0.04 | 700 | 4.2 |
| Comparative sample 14 | 0.83 | 70 | 0.79 | B | 0.06 | 70 | 0.04 | 30 | 4.2 |
| Comparative sample 15 | 0.94 | 25 | 0.74 | B | 0.06 | 25 | 0.20 | 70 | 4.0 |
| Comparative sample 16 | 0.94 | 15 | 0.74 | B | 0.04 | 45 | 0.20 | 70 | 4.2 |
| Comparative sample 17 | 0.94 | 15 | 0.74 | — | — | 45 | 0.20 | 70 | 4.2 |
| Comparative sample 18 | 0.85 | 25 | 0.85 | B | 0.06 | 25 | 0.00 | 16 | 0.8 |

TABLE 3

| | First layer | | | | Second layer | | | |
|---|---|---|---|---|---|---|---|---|
| Sample No. | Temperature (°C.) | Voltage (V) | Current (A) | Pressure (Pa) | Temperature (°C.) | Voltage (V) | Current (A) | Pressure (Pa) |
| Invention sample 1 | 250 | −300 | 100 | 10 | 250 | −300 | 100 | 10 |
| Invention sample 2 | 200 | −400 | 100 | 12 | 200 | −400 | 100 | 12 |
| Invention sample 3 | 250 | −300 | 100 | 10 | 250 | −300 | 100 | 10 |
| Invention sample 4 | 250 | −300 | 120 | 12 | 250 | −300 | 80 | 12 |
| Invention sample 5 | 200 | −400 | 80 | 12 | 200 | −400 | 120 | 12 |
| Invention sample 6 | 250 | −300 | 110 | 10 | 250 | −300 | 90 | 10 |
| Invention sample 7 | 250 | −300 | 100 | 10 | 250 | −300 | 100 | 10 |
| Invention sample 8 | 300 | −200 | 100 | 12 | 300 | −200 | 100 | 12 |
| Invention sample 9 | 250 | −300 | 100 | 10 | 250 | −300 | 100 | 10 |
| Invention sample 10 | 200 | −400 | 100 | 12 | 200 | −400 | 100 | 12 |
| Invention sample 11 | 250 | −300 | 100 | 10 | 250 | −300 | 100 | 10 |

TABLE 3-continued

| | First layer | | | | Second layer | | | |
|---|---|---|---|---|---|---|---|---|
| Sample No. | Temperature (° C.) | Voltage (V) | Current (A) | Pressure (Pa) | Temperature (° C.) | Voltage (V) | Current (A) | Pressure (Pa) |
| Invention sample 12 | 250 | −300 | 100 | 10 | 250 | −300 | 100 | 10 |
| Invention sample 13 | 200 | −400 | 100 | 12 | 200 | −400 | 100 | 12 |
| Invention sample 14 | 250 | −300 | 100 | 10 | 250 | −300 | 100 | 10 |
| Invention sample 15 | 300 | −400 | 100 | 12 | 300 | −400 | 100 | 12 |
| Invention sample 16 | 250 | −300 | 100 | 10 | 250 | −300 | 100 | 10 |
| Invention sample 17 | 200 | −400 | 100 | 10 | 200 | −400 | 100 | 10 |
| Invention sample 18 | 300 | −200 | 100 | 10 | 300 | −200 | 100 | 10 |
| Invention sample 19 | 250 | −300 | 80 | 10 | 250 | −300 | 80 | 10 |
| Invention sample 20 | 250 | −300 | 90 | 10 | 250 | −300 | 90 | 10 |
| Invention sample 21 | 250 | −300 | 110 | 10 | 250 | −300 | 110 | 10 |
| Invention sample 22 | 250 | −300 | 120 | 10 | 250 | −300 | 120 | 10 |
| Invention sample 23 | 300 | −200 | 100 | 12 | 300 | −200 | 100 | 12 |
| Invention sample 24 | 250 | −300 | 100 | 10 | 250 | −300 | 100 | 10 |
| Invention sample 25 | 250 | −300 | 100 | 10 | 250 | −300 | 100 | 10 |

TABLE 4

| | First layer | | | | Second layer | | | |
|---|---|---|---|---|---|---|---|---|
| Sample No. | Temperature (° C.) | Voltage (V) | Current (A) | Pressure (Pa) | Temperature (° C.) | Voltage (V) | Current (A) | Pressure (Pa) |
| Comparative sample 1 | 250 | −300 | 100 | 10 | — | — | — | — |
| Comparative sample 2 | — | — | — | — | 250 | −300 | 100 | 10 |
| Comparative sample 3 | 250 | −300 | 100 | 10 | 250 | −300 | 100 | 10 |
| Comparative sample 4 | 250 | −300 | 100 | 10 | 250 | −300 | 100 | 10 |
| Comparative sample 5 | 250 | −300 | 100 | 10 | 250 | −300 | 100 | 10 |
| Comparative sample 6 | 250 | −300 | 100 | 10 | 250 | −300 | 100 | 10 |
| Comparative sample 7 | 300 | −200 | 100 | 12 | 300 | −200 | 100 | 12 |
| Comparative sample 8 | 250 | −300 | 100 | 12 | 250 | −300 | 100 | 12 |
| Comparative sample 9 | 250 | −300 | 90 | 10 | 250 | −300 | 110 | 10 |
| Comparative sample 10 | 250 | −300 | 100 | 10 | 250 | −300 | 100 | 10 |
| Comparative sample 11 | 250 | −300 | 100 | 10 | 250 | −300 | 100 | 10 |
| Comparative sample 12 | 250 | −300 | 100 | 10 | 250 | −300 | 100 | 10 |
| Comparative sample 13 | 250 | −300 | 80 | 10 | 250 | −300 | 80 | 10 |
| Comparative sample 14 | 250 | −300 | 120 | 10 | 250 | −300 | 120 | 10 |
| Comparative sample 15 | 300 | −200 | 100 | 12 | 300 | −200 | 100 | 12 |
| Comparative sample 16 | 250 | −300 | 80 | 10 | 250 | −300 | 110 | 10 |
| Comparative sample 17 | 250 | −300 | 80 | 10 | 250 | −300 | 110 | 10 |
| Comparative sample 18 | 250 | −300 | 100 | 6 | 250 | −300 | 100 | 6 |

TABLE 5

| | Alternately laminated structure Average composition: $(Al_d M_e Ti_{1-d-e})$ N | |
|---|---|---|
| Sample No. | Composition (d value) | Composition (e value) |
| Invention sample 1 | 0.85 | 0.03 |
| Invention sample 2 | 0.95 | 0.01 |
| Invention sample 3 | 0.80 | 0.06 |
| Invention sample 4 | 0.91 | 0.01 |
| Invention sample 5 | 0.82 | 0.06 |
| Invention sample 6 | 0.88 | 0.04 |
| Invention sample 7 | 0.84 | 0.06 |
| Invention sample 8 | 0.85 | 0.02 |
| Invention sample 9 | 0.85 | 0.03 |
| Invention sample 10 | 0.80 | 0.10 |
| Invention sample 11 | 0.80 | 0.01 |
| Invention sample 12 | 0.85 | 0.03 |
| Invention sample 13 | 0.95 | 0.01 |
| Invention sample 14 | 0.80 | 0.06 |
| Invention sample 15 | 0.80 | 0.10 |
| Invention sample 16 | 0.85 | 0.01 |
| Invention sample 17 | 0.85 | 0.03 |
| Invention sample 18 | 0.85 | 0.03 |
| Invention sample 19 | 0.85 | 0.03 |
| Invention sample 20 | 0.85 | 0.03 |
| Invention sample 21 | 0.85 | 0.03 |
| Invention sample 22 | 0.85 | 0.03 |
| Invention sample 23 | 0.80 | 0.03 |
| Invention sample 24 | 0.95 | 0.02 |
| Invention sample 25 | 0.85 | 0.04 |

TABLE 6

| | Alternately laminated structure Average composition: $(Al_d M_e Ti_{1-d-e})$ N | |
|---|---|---|
| Sample No. | Composition (d value) | Composition (e value) |
| Comparative sample 1 | 0.85 | — |
| Comparative sample 2 | 0.85 | 0.06 |
| Comparative sample 3 | 0.96 | 0.01 |
| Comparative sample 4 | 0.78 | 0.06 |
| Comparative sample 5 | 0.85 | 0.03 |

TABLE 6-continued

| Sample No. | Alternately laminated structure Average composition: $(Al_dM_eTi_{1-d-e})$ N | |
|---|---|---|
| | Composition (d value) | Composition (e value) |
| Comparative sample 6 | 0.87 | 0.03 |
| Comparative sample 7 | 0.85 | 0.03 |
| Comparative sample 8 | 0.85 | 0.03 |
| Comparative sample 9 | 0.94 | — |
| Comparative sample 10 | 0.78 | 0.06 |
| Comparative sample 11 | 0.81 | 0.03 |
| Comparative sample 12 | 0.81 | 0.03 |
| Comparative sample 13 | 0.81 | 0.03 |
| Comparative sample 14 | 0.81 | 0.03 |
| Comparative sample 15 | 0.84 | 0.03 |
| Comparative sample 16 | 0.79 | 0.03 |
| Comparative sample 17 | 0.79 | — |
| Comparative sample 18 | 0.85 | 0.03 |

The ratio $I_{hex}/I_{cub}$ in the alternately laminated structure of the obtained sample was measured by using a model: RINT TTR III, which is an X-ray diffractometer manufactured by Rigaku Corporation. Specifically, the ratio $I_{hex}/I_{cub}$ was calculated by measuring the peak intensity cubic crystal (200) plane of the alternately laminated structure and the peak intensity of the cubic crystal (111) plane of the alternately laminated structure by X-ray diffraction measurement with a 2θ/θ focused optical system using Cu-Kα rays under the conditions of output: 50 kV, 250 mA, incident side solar slit: 5°, divergent vertical slit: ⅔°, divergent vertical limiting slit: 5 mm, scattering slit: ⅔°, light receiving side solar slit: 5°, light receiving slit: 0.3 mm, BENT monochromator, light receiving monochrome slit: 0.8 mm, sampling width: 0.01°, scan speed: 4°/min, and 2θ measurement range: 20° to 70° and calculating the sum $I_{cub}$, and measuring the peak intensity $I_{hex}$ of the hexagonal crystal (110) plane of the alternately laminated structure. The results are shown in Tables 7 and 8. When obtaining the above peak intensity of each plane index from the X-ray diffraction pattern, the analysis software provided with the X-ray diffractometer was used. In the analysis software, each peak intensity was obtained by performing background processing and Kα2 peak removal using a cubic approximation, and performing profile fitting using the Pearson-VII function. Further, the crystal system of the alternately laminated structure was also confirmed by X-ray diffraction measurement. More specifically, the peak intensities of the cubic crystal (200) plane, the cubic crystal (111) plane, and the hexagonal crystal (110) plane of the alternately laminated structure were measured as the measurement objects. At this time, the peaks of the first layer and the peaks of the second layer were not separated, and the peak intensity including both reflections was obtained. For convenience, the above ratio $I_{hex}/I_{cub}$ was calculated from the peak intensities thus obtained, and taken as $I_{hex}/I_{cub}$ of the alternately laminated structure.

For the obtained samples, the residual stress of the alternately laminated structure was measured by a $\sin^2\varphi$ method using an X-ray diffractometer. The stress at any three points included in the part involved in cutting was measured, and the average value (arithmetic mean value) was taken as the residual stress of the alternately laminated structure. More specifically, the residual stress of the alternately laminated structure was measured by selecting the diffraction peak of the cubic crystal (200) plane of the alternately laminated structure. At this time, the peaks of the first layer and the peaks of the second layer were not separated, and the residual stress was obtained from the peaks including both reflections. For convenience, the residual stress thus obtained was taken as the residual stress of the alternately laminated structure. The results are shown in Tables 7 and 8.

TABLE 7

| | Alternately laminated structure | |
|---|---|---|
| Sample No. | $I_{hex}/I_{cub}$ | Residual stress (GPa) |
| Invention sample 1 | 0.05 | −4.8 |
| Invention sample 2 | 0.27 | −7.5 |
| Invention sample 3 | 0.00 | −4.6 |
| Invention sample 4 | 0.26 | −6.2 |
| Invention sample 5 | 0.00 | −8.1 |
| Invention sample 6 | 0.15 | −5.9 |
| Invention sample 7 | 0.05 | −6 |
| Invention sample 8 | 0.20 | −9.6 |
| Invention sample 9 | 0.00 | −2.8 |
| Invention sample 10 | 0.02 | −8.2 |
| Invention sample 11 | 0.12 | −3.2 |
| Invention sample 12 | 0.05 | −5.8 |
| Invention sample 13 | 0.30 | −9.8 |
| Invention sample 14 | 0.00 | −6.3 |
| Invention sample 15 | 0.18 | −8.6 |
| Invention sample 16 | 0.08 | −5.3 |
| Invention sample 17 | 0.00 | −9.8 |
| Invention sample 18 | 0.30 | −2.4 |
| Invention sample 19 | 0.00 | −4.4 |
| Invention sample 20 | 0.00 | −3.6 |
| Invention sample 21 | 0.12 | −6.1 |
| Invention sample 22 | 0.09 | −5.6 |
| Invention sample 23 | 0.32 | −1.8 |
| Invention sample 24 | 0.06 | −6.7 |
| Invention sample 25 | 0.00 | −10.5 |

TABLE 8

| | Alternately laminated structure | |
|---|---|---|
| Sample No. | $I_{hex}/I_{cub}$ | Residual stress (GPa) |
| Comparative sample 1 | 0.00 | −4.2 |
| Comparative sample 2 | 0.06 | −7.9 |
| Comparative sample 3 | 0.52 | −4.9 |
| Comparative sample 4 | 0.00 | −5.7 |
| Comparative sample 5 | 0.04 | −6 |
| Comparative sample 6 | 0.04 | −5.7 |
| Comparative sample 7 | 0.20 | −9.8 |
| Comparative sample 8 | 0.00 | −2.1 |
| Comparative sample 9 | 0.36 | −6.9 |
| Comparative sample 10 | 0.00 | −10.9 |
| Comparative sample 11 | 0.00 | −5.6 |
| Comparative sample 12 | 0.00 | −4.5 |
| Comparative sample 13 | 0.00 | −5 |
| Comparative sample 14 | 0.15 | −6.3 |
| Comparative sample 15 | 0.12 | −1.4 |
| Comparative sample 16 | 0.00 | −7 |
| Comparative sample 17 | 0.00 | −5.4 |
| Comparative sample 18 | 0.00 | −11.2 |

By using the obtained samples, the following cutting test was performed, and the results thereof were evaluated.
Cutting Test
Work material: SUS329J4L,
Work material shape: round bar,
Cutting speed: 180 m/min,
Feed: 0.25 mm/rev,
Depth of cut: 1.0 mm,
Coolant: water-soluble coolant
Evaluation items: the processing time until the flank wear width of the tool exceeded 0.3 mm or the cutting edge was fractured was taken as the tool life. It means that the longer the processing time until the tool life is, the more excellent the fracture resistance and the wear resistance are.

The results of the obtained evaluation are shown in Tables 9 and 10.

TABLE 9

| Sample No. | Cutting test | |
| --- | --- | --- |
| | Damage form | Tool life (min) |
| Invention sample 1 | Flank wear | 16 |
| Invention sample 2 | Flank wear | 18 |
| Invention sample 3 | Flank wear | 16 |
| Invention sample 4 | Flank wear | 17 |
| Invention sample 5 | Flank wear | 14 |
| Invention sample 6 | Flank wear | 15 |
| Invention sample 7 | Flank wear | 14 |
| Invention sample 8 | Flank wear | 18 |
| Invention sample 9 | Flank wear | 13 |
| Invention sample 10 | Flank wear | 18 |
| Invention sample 11 | Flank wear | 12 |
| Invention sample 12 | Flank wear | 14 |
| Invention sample 13 | Flank wear | 15 |
| Invention sample 14 | Flank wear | 14 |
| Invention sample 15 | Flank wear | 15 |
| Invention sample 16 | Flank wear | 12 |
| Invention sample 17 | Flank wear | 15 |
| Invention sample 18 | Flank wear | 13 |
| Invention sample 19 | Flank wear | 15 |
| Invention sample 20 | Flank wear | 13 |
| Invention sample 21 | Flank wear | 21 |
| Invention sample 22 | Flank wear | 14 |
| Invention sample 23 | Flank wear | 10 |
| Invention sample 24 | Flank wear | 16 |
| Invention sample 25 | Flank wear | 12 |

TABLE 10

| Sample No. | Cutting test | |
| --- | --- | --- |
| | Damage form | Tool life (min) |
| Comparative sample 1 | Flank wear | 8 |
| Comparative sample 2 | Fracture | 5 |
| Comparative sample 3 | Fracture | 4 |
| Comparative sample 4 | Flank wear | 8 |
| Comparative sample 5 | Fracture | 5 |
| Comparative sample 6 | Flank wear | 9 |
| Comparative sample 7 | Fracture | 6 |
| Comparative sample 8 | Flank wear | 5 |
| Comparative sample 9 | Flank wear | 6 |
| Comparative sample 10 | Fracture | 4 |
| Comparative sample 11 | Flank wear | 6 |
| Comparative sample 12 | Flank wear | 7 |
| Comparative sample 13 | Flank wear | 7 |
| Comparative sample 14 | Fracture | 6 |
| Comparative sample 15 | Fracture | 3 |
| Comparative sample 16 | Fracture | 7 |
| Comparative sample 17 | Fracture | 5 |
| Comparative sample 18 | Flank wear | 4 |

It was found from the results shown in Tables 9 and 10 that the invention samples in which the coated cutting tool included a substrate and a coating layer formed on the surface of the substrate, the coating layer had an alternately laminated structure having two or more first layers and two or more second layers alternately laminated, the first layer was a compound layer satisfying the formula (1), the second layer was a compound layer satisfying the formula (2), and an average thickness of the alternately laminated structure was 1.0 μm or more and 10.0 μm or less had more excellent fracture resistance and wear resistance than the comparative samples, and had a long tool life.

Example 2

As a substrate, a cemented carbide having a composition of 94.7% WC-5.0% Co-0.3% $Cr_3C_2$ (mass %) processed into an insert shape of CNMG120408-SM (manufactured by Tungaloy Corporation) was prepared. A predetermined metal evaporation source was arranged in the reaction vessel of the arc ion plating device. The prepared substrate was fixed to a fixing bracket of a rotary table in the reaction vessel.

After that, the inside of the reaction vessel was evacuated until the pressure reached a vacuum of $5.0 \times 10^{-3}$ Pa or less. After evacuation, the substrate was heated to 450° C. with a heater in the reaction vessel. After heating, Ar gas was introduced into the reaction vessel so that the pressure became 2.7 Pa.

In the Ar gas atmosphere with a pressure of 2.7 Pa, a bias voltage of −400 V was applied to the substrate, a current of 40 A was passed through the tungsten filament in the reaction vessel, and the surface of the substrate was subjected to ion bombardment treatment with Ar gas for 30 min. After the ion bombardment treatment was completed, the inside of the reaction vessel was evacuated until the pressure reached a vacuum of $5.0 \times 10^{-3}$ Pa or less.

For the invention samples 26 to 30, after vacuuming, the substrate was controlled until the temperature thereof became such as shown in Table 12 (the temperature at the start of film formation), $N_2$ gas was introduced into the reaction vessel, and the pressure inside the reaction vessel was adjusted to that shown in Table 12. Then, the bias voltage shown in Table 12 was applied to the substrate to evaporate the metal evaporation source having the composition of the lower layer shown in Table 11 by the arc discharge of the arc current shown in Table 12 to form a lower layer.

The first layer and the second layer were alternately formed on the surface of the lower layer to form an alternately laminated structure under the same manufacturing conditions of the alternately laminated structure as those of the invention sample 1 for the invention sample 26, the invention sample 2 for the invention sample 27, the invention sample 3 for the invention sample 28, the invention sample 10 for the invention sample 29, and the invention sample 11 for the invention sample 30.

Then, for the invention samples 26 to 28, after vacuuming, the substrate was controlled until the temperature thereof became such as shown in Table 12 (the temperature at the start of film formation), $N_2$ gas was introduced into the reaction vessel, and the pressure inside the reaction vessel was adjusted to that shown in Table 12. Then, the bias voltage shown in Table 12 was applied to the substrate to evaporate the metal evaporation source having the composition of the upper layer shown in Table 11 by the arc discharge of the arc current shown in Table 12 to form an upper layer. After forming each layer on the surface of the substrate to the predetermined average thickness shown in Table 11, the power of the heater was turned off, and after the sample temperature became 100° C. or lower, the sample was taken out from the reaction vessel.

The average thickness and composition of each layer, the ratio $I_{hex}/I_{cub}$ in the alternately laminated structure, and the residual stress of the obtained samples were measured and calculated in the same manner as in Example 1. The results are shown in Tables 11 and 13. In the measurement, the peaks of the alternately laminated structure were specified by the following methods (i) to (iii).
- (i) When the coating layer includes the upper layer, the peaks of the alternately laminated structure were specified by removing the upper layer by buffing.
- (ii) When the coating layer includes the lower layer, the peaks of the alternately laminated structure were specified by a thin-film X-ray diffraction method so as not to be affected by the lower layer.
- (iii) When the coating layer includes the upper layer and the lower layer, the peaks of the alternately laminated structure were specified by combining the above (i) and (ii).

TABLE 11

| | Coating layer | | | | | | | |
|---|---|---|---|---|---|---|---|---|
| | | Alternately laminated structure | | | | | | |
| | | | First layer $(Al_aTi_{1-a})$ N | | Second layer $(Al_bM_cTi_{1-b-c})$ N | | | |
| | Lower layer | | | Average | | | | Average |
| Sample No. | Composition | Average thickness (μm) | Composition (a value) | thickness per layer (nm) | Composition (b value) | Element M | Composition (c value) | thickness per layer (nm) |
| Invention sample 26 | $Ti_{0.30}Al_{0.70}N$ | 0.3 | 0.85 | 25 | 0.85 | B | 0.06 | 25 |
| Invention sample 27 | $Ti_{0.50}Al_{0.50}N$ | 0.3 | 0.95 | 25 | 0.95 | B | 0.02 | 25 |
| Invention sample 28 | TiN | 0.2 | 0.80 | 25 | 0.80 | B | 0.12 | 25 |
| Invention sample 29 | $Ti_{0.75}Al_{0.25}N$ | 0.3 | 0.80 | 25 | 0.80 | B | 0.20 | 25 |
| Invention sample 30 | $Ti_{0.35}Al_{0.60}Si_{0.05}N$ | 0.5 | 0.80 | 25 | 0.80 | B | 0.02 | 25 |

| | Coating layer | | | | | | |
|---|---|---|---|---|---|---|---|
| | Alternately laminated structure | | | | | Upper layer | Total |
| | Composition | Number of | Average composition: $(Al_dM_eTi_{1-d-e})$ N | | Average | | average |
| Sample No. | difference $|a - b|$ | repetitions (times) | Composition (d value) | Composition (e value) | thickness (μm) | Composition | Average thickness (nm) | thickness (um) |
| Invention sample 26 | 0.00 | 80 | 0.85 | 0.03 | 4.0 | TiN | 0.5 | 4.8 |
| Invention sample 27 | 0.00 | 80 | 0.95 | 0.01 | 4.0 | $Ti_{0.50}Al_{0.50}N$ | 1.5 | 5.8 |
| Invention sample 28 | 0.00 | 80 | 0.80 | 0.06 | 4.0 | $Ti_{0.80}Si_{0.20}N$ | 1.0 | 5.2 |
| Invention sample 29 | 0.00 | 80 | 0.80 | 0.10 | 4.0 | — | — | 4.3 |
| Invention sample 30 | 0.00 | 80 | 0.80 | 0.01 | 4.0 | — | — | 4.5 |

TABLE 12

| | Lower layer | | | | Upper layer | | | |
|---|---|---|---|---|---|---|---|---|
| Sample No. | Temperature (° C.) | Voltage (V) | Current (A) | Pressure (Pa) | Temperature (° C.) | Voltage (V) | Current (A) | Pressure (Pa) |
| Invention sample 26 | 250 | −80 | 120 | 7 | 250 | −60 | 120 | 3 |
| Invention sample 27 | 200 | −60 | 120 | 5 | 200 | −60 | 120 | 5 |
| Invention sample 28 | 250 | −60 | 120 | 5 | 250 | −60 | 120 | 3 |
| Invention sample 29 | 200 | −60 | 120 | 3 | — | — | — | — |
| Invention sample 30 | 250 | −60 | 120 | 5 | — | — | — | — |

TABLE 13

| Sample No. | Alternately laminated structure | |
|---|---|---|
| | $I_{hex}/I_{cub}$ | Residual stress (GPa) |
| Invention sample 26 | 0.07 | −6.0 |
| Invention sample 27 | 0.24 | −8.8 |
| Invention sample 28 | 0.00 | −6.6 |
| Invention sample 29 | 0.00 | −8.4 |
| Invention sample 30 | 0.10 | −4.4 |

TABLE 14

| Sample No. | Cutting test | |
|---|---|---|
| | Damage form | Tool life (min) |
| Invention sample 26 | Flank wear | 18 |
| Invention sample 27 | Flank wear | 19 |
| Invention sample 28 | Flank wear | 17 |
| Invention sample 29 | Flank wear | 19 |
| Invention sample 30 | Flank wear | 14 |

By using the obtained samples, the cutting test was performed in the same manner as in Example 1, and the invention samples were evaluated. The results are shown in Table 14.

It was found from the results shown in Table 14 that the invention samples in which the coated cutting tool included a substrate and a coating layer formed on the surface of the substrate, the coating layer had an alternately laminated structure having two or more first layers and two or more second layers alternately laminated, the first layer was a compound layer satisfying the formula (1), the second layer was a compound layer satisfying the formula (2), and an average thickness of the alternately laminated structure was 1.0 μm or more and 10.0 μm or less, and which further had a lower layer or a lower layer and an upper layer had more excellent fracture resistance and wear resistance, and a further long tool life.

INDUSTRIAL APPLICABILITY

Since the coated cutting tool of the invention has excellent wear resistance and fracture resistance, the tool life can be extended as compared with that in the related art. Therefore, the coated cutting tool has high industrial applicability in this respect.

REFERENCE SIGNS LIST

1: Substrate, 2: First layer, 3: Second layer, 4: Coating layer, 5: Coated cutting tool.

What is claimed is:

1. A coated cutting tool comprising a substrate and a coating layer formed on the substrate, wherein
   the coating layer has an alternately laminated structure of a first layer and a second layer;
   the first layer contains a compound having a composition represented by a following formula (1):

$$(Al_aTi_{1-a})N \quad (1)$$

(in the formula (1), a is an atomic ratio of an Al element to a total of the Al element and a Ti element and satisfies 0.80≤a≤0.95);
   the second layer contains a compound having a composition represented by a following formula (2):

$$(Al_bM_cTi_{1-b-c})N \quad (2)$$

(in the formula (2), M represents at least one of Si or B, b is an atomic ratio of the Al element to a total of the Al element, an M element and the Ti element and satisfies 0.80≤b≤0.95, and c is an atomic ratio of the M element to the total of the Al element, the M element and the Ti element and satisfies 0<c≤0.20);
   a and b satisfy |a−b|≤0.05; and
   an average thickness of the alternately laminated structure is 1.0 μm or more and 10.0 μm or less,
   wherein a residual stress of the alternately laminated structure is −10.0 GPa or more and −3.0 GPa or less, and
   where a sum of diffraction peak intensities of a cubic crystal (111) plane and a cubic crystal (200) plane is denoted by $I_{cub}$ and a diffraction peak intensity of a hexagonal crystal (110) plane is denoted by $I_{hex}$ in X-ray diffraction of the alternately laminated structure, $I_{hex}/I_{cub}$ is 0 or more and 0.30 or less.

2. The coated cutting tool according to claim 1, wherein an average thickness per layer of the first layer is 5 nm or more and 50 nm or less; and
   an average thickness per layer of the second layer is 5 nm or more and 50 nm or less.

3. The coated cutting tool according to claim 1, wherein a composition of the entire compound of the alternately laminated structure is represented by a following formula (3):

$$(Al_dM_eTi_{1-d-e})N \quad (3)$$

(in the formula (3), M represents at least one of Si or B; d is an atomic ratio of the Al element to the total of the Al element, the M element and the Ti element and satisfies 0.80≤d≤0.95, and e is an atomic ratio of the M element to the total of the Al element, the M element and the Ti element and satisfies 0<e<0.20).

4. The coated cutting tool according to claim 3, wherein 0<e≤0.10 is satisfied in the formula (3).

5. The coated cutting tool according to claim 1, wherein the coating layer has a lower layer between the substrate and the alternately laminated structure;
   the lower layer is a single layer or a multilayer of a compound composed of at least one element selected from the group consisting of Ti, Zr, Hf, V, Nb, Ta, Cr, Mo, W, Al, Si, and Y and at least one element selected from the group consisting of C, N, O, and B (provided that, the compound composed of the composition represented by the formula (1) and the compound composed of the composition represented by the formula (2) are excluded); and
   an average thickness of the lower layer is 0.1 μm or more and 2.0 μm or less.

6. The coated cutting tool according to claim 1, wherein the coating layer has an upper layer on a surface opposite to the substrate in the alternately laminated structure;
   the upper layer is a single layer or a multilayer of a compound composed of at least one element selected from the group consisting of Ti, Zr, Hf, V, Nb, Ta, Cr, Mo, W, Al, Si, and Y and at least one element selected from the group consisting of C, N, O, and B (provided that, the compound composed of the composition represented by the formula (1) and the compound composed of the composition represented by the formula (2) are excluded); and
   an average thickness of the upper layer is 0.1 μm or more and 2.0 μm or less.

7. The coated cutting tool according to claim 1, wherein an average thickness of an entire coating layer is 1.0 μm or more and 10.0 μm or less.

8. The coated cutting tool according to claim 2, wherein a composition of the entire compound of the alternately laminated structure is represented by a following formula (3):

$$(Al_d M_e Ti_{1-d-e})N \qquad (3)$$

(in the formula (3), M represents at least one of Si or B; d is an atomic ratio of the Al element to the total of the Al element, the M element and the Ti element and satisfies 0.80≤d≤0.95, and e is an atomic ratio of the M element to the total of the Al element, the M element and the Ti element and satisfies 0<e<0.20).

9. The coated cutting tool according to claim 8, wherein 0<e≤0.10 is satisfied in the formula (3).

10. The coated cutting tool according to claim 2, wherein where a sum of diffraction peak intensities of a cubic crystal (111) plane and a cubic crystal (200) plane is denoted by $I_{cub}$ and a diffraction peak intensity of a hexagonal crystal (110) plane is denoted by $I_{hex}$ in X-ray diffraction of the alternately laminated structure, $I_{hex}/I_{cub}$ is 0 or more and 0.30 or less.

11. The coated cutting tool according to claim 3, wherein where a sum of diffraction peak intensities of a cubic crystal (111) plane and a cubic crystal (200) plane is denoted by $I_{cub}$ and a diffraction peak intensity of a hexagonal crystal (110) plane is denoted by $I_{hex}$ in X-ray diffraction of the alternately laminated structure, $I_{hex}/I_{cub}$ is 0 or more and 0.30 or less.

12. The coated cutting tool according to claim 4, wherein where a sum of diffraction peak intensities of a cubic crystal (111) plane and a cubic crystal (200) plane is denoted by $I_{cub}$ and a diffraction peak intensity of a hexagonal crystal (110) plane is denoted by $I_{hex}$ in X-ray diffraction of the alternately laminated structure, $I_{hex}/I_{cub}$ is 0 or more and 0.30 or less.

13. A coated cutting tool comprising a substrate and a coating layer formed on the substrate, wherein
the coating layer has an alternately laminated structure of a first layer and a second layer;
the first layer contains a compound having a composition represented by a following formula (1):

$$(Al_a Ti_{1-a})N \qquad (1)$$

(in the formula (1), a is an atomic ratio of an Al element to a total of the Al element and a Ti element and satisfies 0.80≤a≤0.95);
the second layer contains a compound having a composition represented by a following formula (2):

$$(Al_b M_c Ti_{1-b-c})N \qquad (2)$$

(in the formula (2), M represents B, b is an atomic ratio of the Al element to a total of the Al element, an M element and the Ti element and satisfies 0.80≤b≤0.95, and c is an atomic ratio of the M element to the total of the Al element, the M element and the Ti element and satisfies 0<c≤0.20);
a and b satisfy |a−b|≤0.05; and
an average thickness of the alternately laminated structure is 1.0 μm or more and 10.0 μm or less;
wherein an average thickness per layer of the first layer is 5 nm or more and 50 nm or less;
wherein an average thickness per layer of the second layer is 5 nm or more and 50 nm or less; and
wherein a sum of diffraction peak intensities of a cubic crystal (111) plane and a cubic crystal (200) plane is denoted by $I_{cub}$ and a diffraction peak intensity of a hexagonal crystal (110) plane is denoted by $I_{hex}$ in X-ray diffraction of the alternately laminated structure, $I_{hex}/I_{cub}$ is 0 or more and 0.30 or less.

* * * * *